United States Patent [19]

Kleinberg

[11] 4,417,215

[45] Nov. 22, 1983

[54] TUNED ANALOG NETWORK

[75] Inventor: Leonard L. Kleinberg, Greenbelt, Md.

[73] Assignee: The United States of America as represented by the Administrator of the National Aeronautics and Space Administration, Washington, D.C.

[21] Appl. No.: 301,077

[22] Filed: Sep. 10, 1981

[51] Int. Cl.³ .............................................. H03F 1/34
[52] U.S. Cl. .................................... 330/107; 330/109
[58] Field of Search ........................ 330/107, 108, 294

[56] References Cited

PUBLICATIONS

Wireless World Oct. 1977, vol. 83, No. 1502 "Low Noise RIAA Amplifier".
Active Filter Has Separate Band and Frequency Controls, John Jenkins, p. 132 NSWC/WOL/TR 75-170, FIG. 4.

Primary Examiner—James B. Mullins
Assistant Examiner—Gene Wan
Attorney, Agent, or Firm—John O. Tresansky; John R. Manning; Robert E. Bushnell

[57] ABSTRACT

A non-inverting, direct current amplifier stage is cascaded into an integrator stage to form a two stage tuned network (10) having a single input junction common to both stages. The network provides independent adjustment of center frequency, bandwidth and voltage gain. The insertion of a positive feedback loop between the stages provides a very narrow bandwidth network (10'). The addition of back-to-back zener diodes between the common input node and ground converts the network into an oscillator (10").

16 Claims, 3 Drawing Figures

TUNED ANALOG NETWORK

ORIGIN OF THE INVENTION

The invention described herein was made by an employee of the United States Government and may be manufactured and used by or for the Government for governmental purposes without the payment of any royalties thereon or therefor.

TECHNICAL FIELD

This invention pertains to semiconductor analog networks and, more particularly, to networks formed by cascaded inductorless active semiconductor stages to provide independent control of network variables.

BACKGROUND ART

Active tuned networks using operational amplifiers may be characterized by three variables: center frequency, bandwidth and voltage gain. Center frequency may be controlled by the inductance of a network although, at lower frequencies, lumped inductances are either not readily available or are too large to be used in conjunction with electronic circuits. At higher frequencies, lumped inductances cannot be easily integrated either monolithically or in hybrid form into an integrated circuit. Consequently, it is necessary to synthesize an equivalent network inductance with resistive capacitive parameters to provide control of center frequency at low frequencies and in integrated circuit networks.

Analysis of presently available tuned networks reveals that the passive parameters controlling center frequency may also affect bandwidth and voltage gain. Changing the value of one parameter to adjust a single variable inevitably affects other variables. For example, in a Wien bridge used as a bandpass filter adjustment of frequency affects both bandwidth and gain. Additionally, instability due to temperature variations, inaccurate component values and changing component tolerances affect all network variables thereby complicating tuning.

A conventional approach toward providing some degree of independence between control of bandpass filter network parameters uses a resistive-capacitive pair in conjunction with an active device to synthesize a variable tuning inductor. A second resistive-capacitive pair coupled across the output terminal of the active device provides center frequency tuning adjustment independently of bandwidth and voltage gain adjustments. Voltage gain, however, changes slightly with adjustment of bandwidth. For this approach, it is necessary to match the resistive-capacitive pairs to synthesize a nearly ideal inductor and thereby heighten the degree of independence between adjustable circuit variables. The disadvantages of this type of network arise from its requirement for matched resistive-capacitive pairs, a requirement which increases both the number of component parts in the circuit and the cost of the circuit because of the greater expense in obtaining matched components. In an active bandpass filter network, a matched resistive-capacitive pair is usually more expensive than the active device alone.

STATEMENT OF THE INVENTION

Accordingly, it is an object of this invention to provide a filter network in which frequency, bandwidth and gain are independently established.

It is another object to provide a bandpass filter network in which center frequency may be adjusted independently of other network variables.

It is yet another object to provide an inductorless, tunable analog network.

It is a further object to provide an inexpensive filter network in which frequency, bandwidth and gain are independently controlled.

It is still further object to provide an easily tuned, narrow bandwidth filter network.

It is also an object to provide an inexpensive oscillator.

These and other objects are achieved with a bandwidth filter network for lower frequencies, having two cascaded linear active device stages in which the first stage is a non-inverting direct current amplifier resistively coupled to an inverting port of an active integrator second stage. A current source applies a signal current directly to the non-inverting ports of the active devices to ameliorate the effects of network load and a signal source upon each other. Voltage gain for the first stage is independently set by two external resistances in the amplifier stage. Center frequency tuning may be obtained independently of other network variables by a resistance coupling the non-inverting ports of both stages with the output port of the integrator stage. A filtered signal is provided directly from the output port of either stage, depending upon the gain and phase shift sought.

In one alternative embodiment, a resistance coupling the non-inverting ports of both stages to the output port of the first stage effectively provides a positive feedback loop and serves as a Q-multiplier thereby narrowing bandwidth. In another alternative embodiment, the network may be used as an oscillator by substituting voltage controlled resistances for the first stage resistance and by stabilizing the voltage amplitude at the non-inverting ports of both stages.

BRIEF DESCRIPTION OF THE DRAWINGS

A more complete appreciation of this invention and many of the attendant advantages thereof will be readily apparent as the same becomes better understood by reference to the following detailed description when considered in conjunction with the accompanying drawings in which like reference symbols indicate the same or similar components, and wherein.

DETAILED DESCRIPTION OF THE INVENTION

Figure 1:
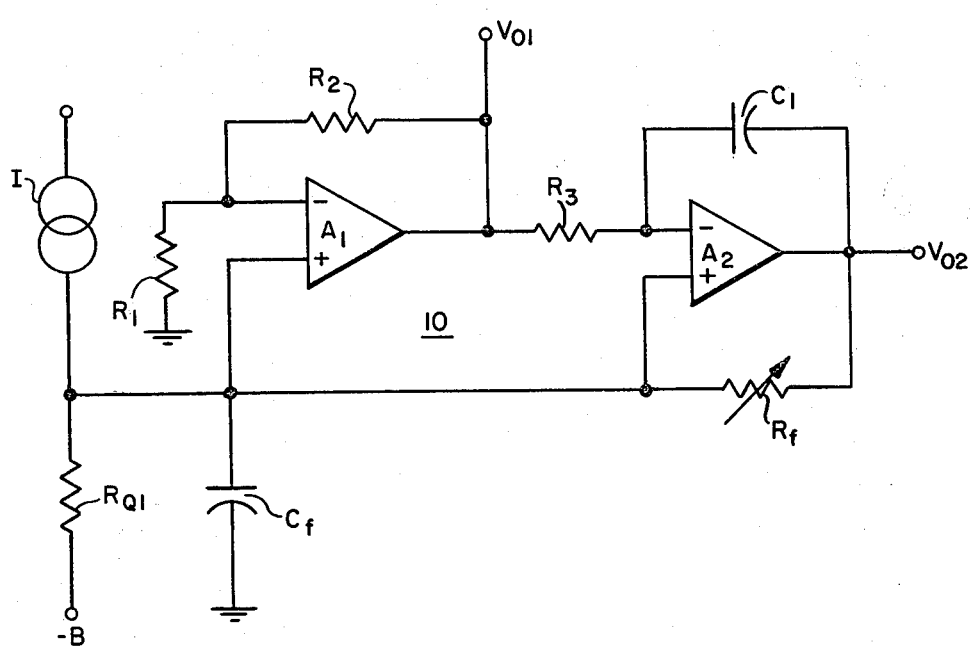
FIG. 1 is a schematic representation of one embodiment of the invention.

Referring now to the drawings and, in particular, to FIG. 1, where a schematic illustrates a two stage bandpass filter network 10 in which both stages use a linear integrated, dual-input, differential amplifier $A_1$, $A_2$ as an operational voltage amplifier. The first stage is a non-inverting, direct current amplifier which has a resistance $R_1$ coupled between a local network reference potential such as ground and an inverting port of operational amplifier $A_1$. A feedback loop is formed in the first stage by coupling a resistance $R_2$ between the inverting and output ports of operational amplifier $A_1$. The first stage amplifies any signal applied to its non-inverting port without causing any phase shift. Voltage gain for the amplifier stage is controlled by the values of resistances $R_1$, $R_2$. A current source I drives a resistance $R_{Q1}$ coupled between non-inverting ports of both stages and a negative voltage source; the difference between the negative voltage and the voltage drop across the driven resistance sets the common voltage level at the non-inverting ports.

The second stage, which operates as a linear integrator, has an inverting port of operational amplifier $A_2$ interconnected by a resistance $R_3$ with the output port of operational amplifier $A_1$. Operational amplifiers $A_1$ and $A_2$ share a common input junction at their non-inverting ports and a common node between the output port of operational amplifier $A_1$ and resistance $R_3$. A capacitance $C_1$, coupled across the inverting and output ports of operational amplifier $A_2$, completes the feedback loop of the integrator stage.

A variable resistance $R_f$ is coupled between the output port of operational amplifier $A_2$ and the non-inverting ports of operational amplifiers $A_1$, $A_2$. In this configuration, the admittance at the non-inverting port of operational amplifier $A_1$ is given by:

$$Y_{in} = \frac{1-k}{R_f} = \frac{1}{sC_1R_3R_f} . \quad (1)$$

In effect, the passive parameters of the cascaded first and second stages synthesize a first order equivalent inductance because the admittance at $Y_{in}$ is inversely proportional to frequency. The value of this inductance, $L_{eq}$, is therefore given by:

$$L_{eq} = C_1 R_3 R_f. \quad (2)$$

This value is the equivalent inductance appearing at the common junction of the non-inverting ports. It is not a bilateral value, however, and appears as a different value in the admittance at the output ports.

A capacitance $C_f$ connected between the common junction of the non-inverting ports of operational amplifiers $A_1$, $A_2$ and a reference potential is in parallel with the synthesized inductance provided by the cascaded first and second stages. Consequently, $C_f$ and $L_{eq}$ form a parallel tuned LC circuit determining the center frequency $\omega_o$ of the network. By analysis:

$$\omega_o^2 = \frac{1}{C_f L_{eq}} = \frac{1}{C_f C_1 R_3 R_f} . \quad (3)$$

Resistance $R_{Q1}$, in addition to setting the common direct voltage level on the junction of the non-inverting ports of operational amplifiers $A_1$, $A_2$, may be used to control bandwidth by selecting its value as:

$$R_{Q1} = Q X_{L_{eq}}, \quad (4)$$

where Q is defined as the $-3db$ gain of the network.

A bandpass filtered signal may be taken from either output port, $V_{01}$, $V_{02}$ of operational amplifier $A_1$ or $A_2$, respectively. Port $V_{01}$ generally exhibits a capacitive impedance and a lower gain than port $V_{02}$. Disregarding any gain introduced by the current source I, at port $V_{01}$ a filtered signal exhibits a voltage gain:

$$G_1 = \frac{R_1 + R_2}{R_1} . \quad (5)$$

Port $V_{02}$ is available to provide a filtered signal for single frequency operation. Over a range of frequencies it exhibits a true bandpass characteristic. A filtered signal taken at $V_{02}$ exhibits a bandpass characteristic although with a steeper fall-off and a higher voltage gain:

$$G_2 = G_1 \left[ 1 - \frac{1}{SC_1R_3} \right] . \quad (6)$$

Additionally, a filtered signal taken at port $V_{02}$ exhibits a nearly ninety degree phase shift due to the reactance introduced by capacitor $C_1$.

The center frequency for network 10 may be varied by adjusting the values of either capacitance $C_1$ or resistances $R_3$ or $R_f$ because all of these components are factors in the determination of $L_{eq}$. Capacitance $C_1$ and resistance $R_3$ influence the gain at port $V_{02}$, although not at $V_{01}$. Resistance $R_f$ may be used, therefore, to vary the center frequency independently of gain at either port $V_{01}$ or $V_{02}$.

Figure 2:
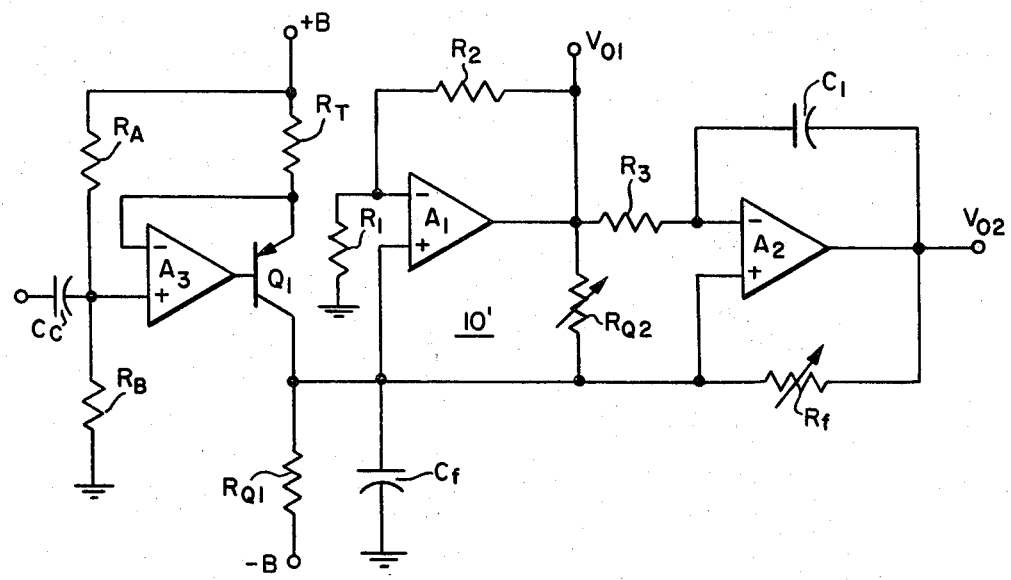
FIG. 2 is a schematic representation of an alternative embodiment of the invention.

FIG. 2 illustrates a modification of the network of FIG. 1 with the addition of a variable resistance $R_{Q2}$ between the non-inverting ports of operational amplifiers $A_1$, $A_2$ and the output port of operational amplifier $A_1$. This addition provides a bandpass filter network 10' with a positive feedback loop between the amplifier and integrator stages. By analysis, for $R_{Q1} < R_{Q2}$, $$R_{eq} = \frac{R_{Q1}(-R_{Q2})}{(R_{Q1} - R_{Q2})} . \quad (7)$$

If the absolute value of resistance $R_{Q2}$ is greater than the absolute value of $R_{Q1}$, then the equivalent parallel resistance has a large, positive value. In effect, resistance $R_{Q2}$ may be used to greatly increase the value of Q by narrowing the bandwidth of the network, especially where other considerations such as a desired to use resistance $R_{Q1}$ to set the direct voltage level on the non-inverting ports of operational amplifiers $A_1$, $A_2$, limit the range of values available for $R_{Q1}$.

A current source suitable for use with the filter networks of this invention is also shown in FIG. 2. The current source is formed with an operational amplifier $A_3$ driving the base of a bipolar transistor $Q_1$. A capacitive coupling $C_c$ connects a signal source to the non-inverting port of operational amplifier $A_3$ while the inverting port is directly coupled to the emitter of $Q_1$. Resistances $R_A$, $R_B$ bias the non-inverting port. Resistances $R_T$ and $R_{Q1}$ set the gain of the current source with the value of resistance $R_{Q1}$ preferably selected to set the amplitude of direct current at the collector of $Q_1$ at zero, thus permitting a wider variation in the amplitude of signal current.

Figure 3:
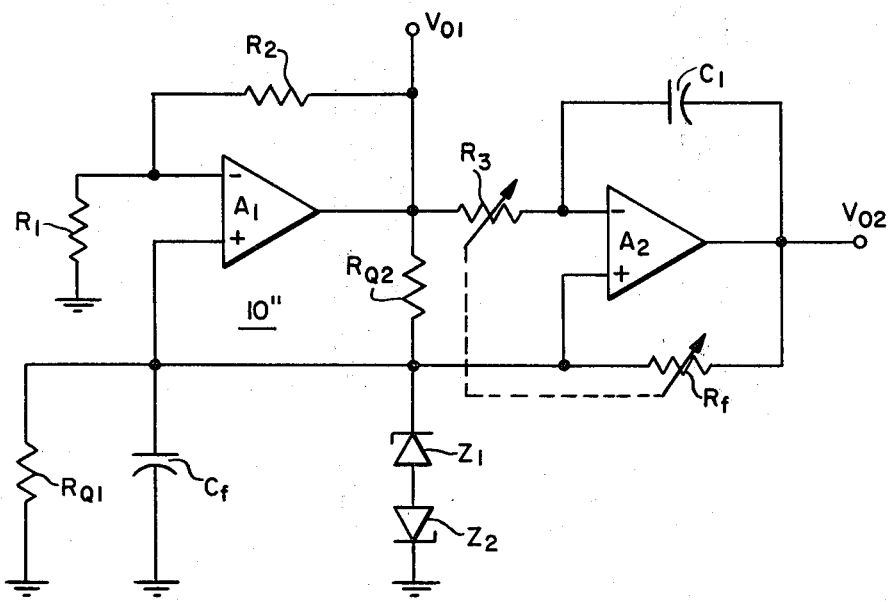
FIG. 3 is a schematic representation of another alternative embodiment of the invention.

FIG. 3 illustrates another embodiment of the network of this invention operating as an oscillator 10". To assure oscillation, the value of the feedback resistance, $R_{Q2}$, should be less than the value of $R_{Q1}$. Amplitude stabilization may be provided by various means such as with a pair of back-to-back zener diodes $Z_1$, $Z_2$ inserted between the non-inverting ports of operational amplifiers $A_1$, $A_2$ and a network reference potential such as ground. Resistances $R_3$ and $R_f$ may be ganged tuned to provide precision adjustment of frequency.

It is apparent, therefore, that the networks described synthesize a first order reactance with a minimum of components and thereby provide inexpensive, versatile tuned circuits readily adaptable for use at lower frequencies as bandpass filters high-Q filters, and oscillators. When used as a filter, network variables such as center frequency, bandwidth and voltage gain may be independently adjusted without effect upon the behavior of each other. Optionally, provision for incorporation of a single positive feedback loop allows these networks to give very narrow prescribed bandwidths while maintaining independence between the establishment of center frequency, bandwidth and voltage gain. Additionally, their suitability for use as an oscillator is illustrative of the versatility of these networks. In any of these applications, these networks may be constructed with ordinary components without the expense of inductors or matched passive components.

It is to be noted that the phrase "active device" is used here to generally indicate electronic components exhibiting transistance properties such as gain. It is possible, therefore, to practice the principles disclosed with active devices other than the dual-input differential type operational amplifiers used to illustrate the foregoing embodiments.

I claim:

1. An active network, comprising:
   means for establishing an input junction with a common potential;
   means coupled to said input junction for providing a first order reactance;
   means coupled to said input junction for amplifying without phase shift a signal applied to said input junction;
   means coupled to said input junction for shifting the phase of said applied signal and cascaded with said amplifying means to form an equivalent first order reactance at said input junction opposite in polarity to said providing means reactance, each of said amplifying and shifting means providing an output signal;
   and
   means coupled across said phase shifting means for tuning said equivalent first order reactance to create a resonant circuit at said input junction.

2. The network of claim 1 wherein said providing means reactance comprises a capacitive reactance and said equivalent first order reactance comprises an inductive reactance.

3. The network of claim 2 further comprising means for applying a signal to said input junction.

4. The network of claims 2 and 3 further comprising means coupled to said input junction for providing a positive feedback at a node between said cascaded amplifying and phase shifting means.

5. The network of claim 4 wherein said junction means and said feedback means comprise resistive impedances having magnitudes in a predetermined relation.

6. The network of claim 5 wherein the magnitude of said junction resistive impedance means is lesser in value than said feedback resistive impedance means.

7. The network of claim 5 wherein the magnitude of said feedback resistive impedance means is lesser in value than said junction resistive impedance means.

8. An active network, comprising:
   a first resistance coupled to an input junction;
   an active amplifier stage having a non-inverting port coupled to said input junction and an output port providing a voltage gain signal;
   an active integrator stage exhibiting a second resistance and a first reactance, having an inverting port receptively cascaded with said amplifier stage, a non-inverting port coupled to said input junction, and an output port providing a phase shifted signal;
   a feedback resistance coupling said integrator stage output port to said input junction to produce an equivalent reactance from said stages equal in magnitude to the product of said first reactance and said second and feedback resistances; and
   a second reactance having a magnitude equal to the inverse of said equivalent reactance coupling said input junction to a network reference potential to form a resonant circuit with said equivalent reactance at a tuned frequency.

9. The network of claim 8 wherein said equivalent reactance comprises an inductive reactance and said second reactance comprises a capacitive reactance.

10. The network of claim 9 further comprising means for applying a signal to said input junction.

11. The network of claims 8 or 9 further comprising means for coupling a node between said cascaded stages with said input junction.

12. The network of claim 11 wherein said coupling means comprises a second resistance having a magnitude in a predetermined relation with said first resistance.

13. The network of claim 12 wherein said first resistance is lesser in magnitude than said second resistance.

14. The network of claim 12 wherein said second resistance is lesser in magnitude than said first resistance.

15. An active network, comprising:
   first and second devices having non-inverting, inverting, and output ports;
   a first resistance coupled between said first device output port and said second device inverting port;
   a first capacitance coupled between said second device inverting and output ports;
   a second resistance coupled between said first and second device non-inverting ports and said second device output port;
   a third resistance coupled between said first device inverting port and a network output reference potential;
   a fourth resistance coupled between said first device inverting and output ports; and
   a fifth resistance coupled between said non-inverting ports and a network output reference potential;
   a second capacitance coupled between said non-inverting ports and said network output reference potential to provide a tuned circuit having a resonant radian frequency, said second capacitance having a value equal to the inverse product of said first and second resistances, said first capacitance, and the square of said resonant radian frequency.

16. The network of claim 15 further comprising a sixth resistance coupled between said non-inverting ports and said first device output port.

* * * * *